United States Patent
Yamaji

[11] Patent Number: 5,925,936
[45] Date of Patent: Jul. 20, 1999

[54] SEMICONDUCTOR DEVICE FOR FACE DOWN BONDING TO A MOUNTING SUBSTRATE AND A METHOD OF MANUFACTURING THE SAME

[75] Inventor: Yasuhiro Yamaji, Kawasaki, Japan

[73] Assignee: Kabushiki Kaisha Toshiba, Kawasaki, Japan

[21] Appl. No.: 08/807,816

[22] Filed: Feb. 26, 1997

[30] Foreign Application Priority Data

Feb. 28, 1996 [JP] Japan ................................ 8-041425

[51] Int. Cl.[6] ........................ H01L 23/48; H01L 23/29
[52] U.S. Cl. ................... 257/787; 257/790; 257/778; 257/737; 257/738; 257/788
[58] Field of Search ............................ 257/790, 778, 257/737, 738, 787, 788

[56] References Cited

U.S. PATENT DOCUMENTS

| 5,600,180 | 2/1997 | Kusaka et al. ................. 257/737 |
|---|---|---|
| 5,757,078 | 5/1998 | Matsuda et al. ............... 257/737 |

FOREIGN PATENT DOCUMENTS

| 402105446 | 4/1990 | Japan ........................ 257/790 |
|---|---|---|
| 40213757 | 5/1990 | Japan ........................ 257/790 |
| 4-260358 | 9/1992 | Japan . | |

*Primary Examiner*—Peter Toby Brown
*Assistant Examiner*—Hung Van Duong
*Attorney, Agent, or Firm*—Finnegan, Henderson, Farabow, Garrett & Dunner, L.L.P.

[57] ABSTRACT

Resin meltable at a time of reflowing is provided on the surface of a semiconductor chip and top ends of the connection electrodes are located parallel with the surface of the resin. A semiconductor chip is mounted on a mounting substrate and, upon reflowing, the resin is molten to allow the semiconductive chip to be bonded to the mounting substrate and encapsulate a resultant structure.

9 Claims, 4 Drawing Sheets

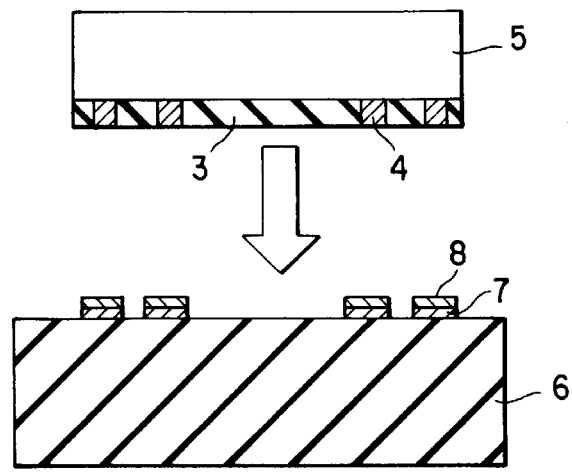
F I G. 3A
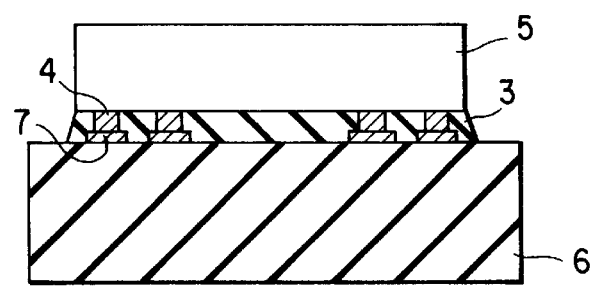
F I G. 3B
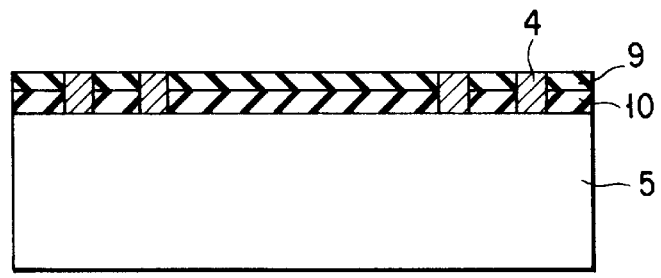
F I G. 4
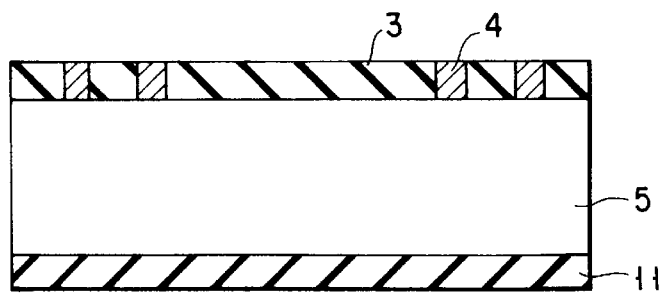
F I G. 5

SEMICONDUCTOR DEVICE FOR FACE DOWN BONDING TO A MOUNTING SUBSTRATE AND A METHOD OF MANUFACTURING THE SAME

BACKGROUND OF THE INVENTION

The present invention relates to a semiconductor device for face down bonding to a mounting substrate and a method for manufacturing the same.

FIG. 9 shows a conventional method for mounting a semiconductor chip directly on a mounting substrate.

First, bump electrodes 2 are provided on an electrode, not shown, provided on a semiconductor wafer or a semiconductor chip 5. In the case where bump electrodes are to be formed on the semiconductor wafer, the semiconductor wafer is diced into semiconductor chips 5.

Then the semiconductor chip 5 is face down bounded to the mounting substrate 6 by a flip-chip bonding technique so as to connect the bump electrodes 2 to substrate electrodes 7 on a mounting substrate 6.

Then, a reflow process is carried out.

Thereafter, in order to improve the heat resistance fatigue, moisture resistance, etc., and ensure the mechanical protection, resin is filled in a clearance between the semiconductor chip 5 and the mounting substrate 6.

FIG. 10 shows another conventional semiconductor chip mounting method.

First, a semiconductor chip is resin-sealed in a semiconductor package 15 or a semiconductor chip is mounted in a ceramic- or a metal-package 15.

Thereafter, the semiconductor package 15 is mounted on a mounting substrate 6.

In the case where the semiconductor chip is to be mounted directly on the substrate, it is necessary to carry out a resin filling step after the semiconductor chip has been mounted on the substrate. For this reason, the assembling cost is increased.

Further, in the case where the semiconductor chip is sealed in the semiconductor package and a resultant package is mounted on the substrate, a so-mounted product becomes bulkier because it uses the package. This decreases the number of semiconductor devices mountable on the mounting substrate and hence lowers the mounting efficiency.

BRIEF SUMMARY OF THE INVENTION

It is accordingly the object of the present invention to provide a semiconductor device which can achieve substantially the same mounting efficiency as that of a bare chip mounting method, while achieving the same extent of reliability as a normal package-sealed semiconductor device, and can lower its full cost.

The object of the present invention is achieved by the following arrangement.

According to one aspect of the present invention there is provided a semiconductor device comprising:

a semiconductor chip; bump electrodes provided on the semiconductor chip; and a protection film coated on a surface of the semiconductor chip, allowing a top surface of the bump electrodes to be exposed, and adapted to, when the semiconductor chip is to be mounted, be molten and bond the semiconductor chip to a mounting substrate and encapsulate a resultant structure.

According to another aspect of the present invention, there is provided a method for manufacturing a semiconductor device, comprising the steps of:

forming bump electrodes on a surface of a semiconductor chip;

coating, on a surface of a semiconductor chip including the bump electrodes, a protection film enough thick to completely cover the bump electrodes, the protection film being allowed to be molten at a time of mounting the semiconductor chip, bond the chip to a mounting substrate and encapsulate the chip; and polishing the protection film and bump electrodes until the bump electrodes are exposed and their exposed areas become enough great to be bonded.

According to another aspect of the present invention there is provided a package structure comprising:

a mounting substrate;

connection terminals provided on a surface of the mounting substrate;

a soldering or brazing material provided on the connection terminals to allow terminal connection;

a semiconductor chip whose surface is so located as to face the surface of the mounting substrate;

bump electrodes provided on the surface of the semiconductor chip, the bump electrode being connected to the connection terminal by melting the soldering or brazing material for terminal connection; and a protection film covered on the facing surface of the semiconductor chip in a manner to expose top surfaces of the bump electrodes, the protection film being allowed to be molten, at a time of melting the soldering or brazing material, bond the semiconductor chip to the mounting substrate and encapsulate the chip.

According to another aspect of the present invention there is provided a method for manufacturing a package structure, comprising the steps of:

locating a semiconductor device on a mounting substrate in an aligned relation, the semiconductor device having a semiconductor chip, bump electrodes provided on the semiconductor chip and a protection film covering a surface of the semiconductor chip with top surfaces of the bump electrodes exposed and the mounting substrate having connection terminals on a surface with a soldering or brazing material provided on the connection terminals to allow terminal connection, the locating step being so done as to locate the bump-electrode-carrying surface side of the semiconductor chip opposite to the mounting substrate with the bump electrodes aligned with the soldering or brazing material; and heating the soldering or brazing material on the terminals of the mounting substrate to a temperature above a melting point to allow the bump electrodes to be connected to the connection terminals, bond the semiconductor chip to the mounting substrate and encapsulate a resultant structure.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 3A and 3B show the first embodiment;

FIG. 4 is a cross-sectional view showing a second embodiment of the present invention;

FIG. 5 is a cross-sectional view showing a third embodiment of the present invention;

DETAILED DESCRIPTION OF THE INVENTION

Figure 1A:
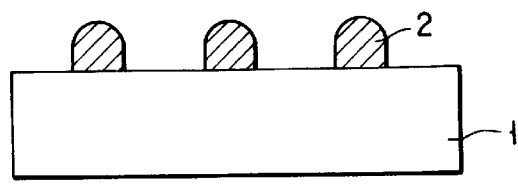
FIGS. 1A to 1C show a first embodiment of the present invention.

FIGS. 1A to 3B show a first embodiment of the present invention. Throughout the drawing, the same reference numerals are employed to designate parts or elements of the embodiments according to the present invention.

As shown in FIG. 1A, metal bump electrodes 2 are formed, by a plating method for instance, on the electrode terminals, not shown, of semiconductor elements of a wafer 1. As the material of the bump electrode use is made of a metal material, such as a solder and gold, which is readily bonded by soldering to a mounting substrate.

Figure 1B:
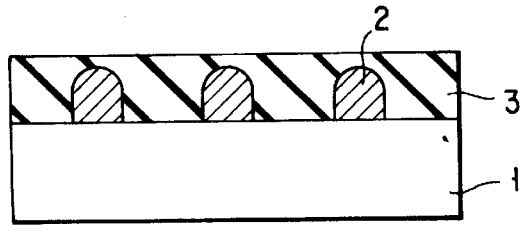

Then, as shown in FIG. 1B, a thermoplastic resin 3 is coated, by a spin coating method for instance, on a wafer 1 surface with bump electrodes formed thereon. The thermoplastic resin 3 completely covers the top and side surfaces of the bump electrodes 2. That is, the surface of the thermoplastic resin 3 lies in a position higher than the tops of the bump electrodes 2 and the bump electrodes 2 are buried with the thermoplastic resin 3. The glass transition temperature of the thermoplastic resin 3 is equal to, or less than, the melting point of a brazing or soldering material for use in making a terminal-to-terminal connection upon the mounting of a semiconductor chip on the mounting substrate.

Figure 1C:
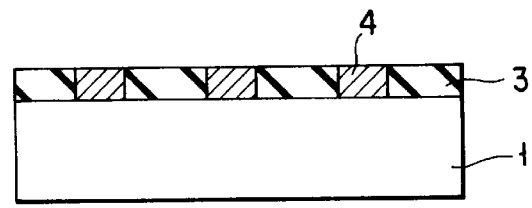

Then, as shown in FIG. 1C, the thermoplastic resin 3 and bump electrode 2 are polished parallel with the wafer surface. At this time, until the top surface of the bump electrode 2 is exposed and the exposed area of the bump electrode 2 becomes enough wide for a solder bond to be effected, the thermoplastic resin 3 and bump electrode are polished, so that connection electrode 4 is provided on the semiconductor device.

Figure 2A:
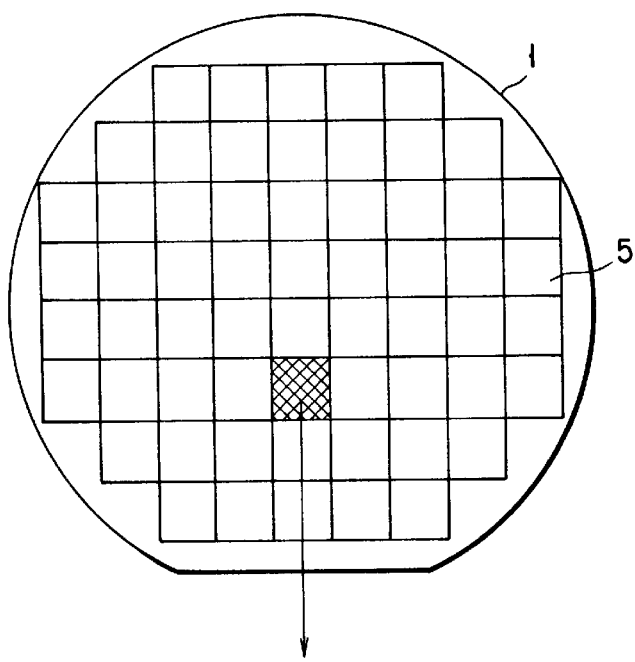
FIGS. 2A and 2B show the first embodiment.
Figure 2B:
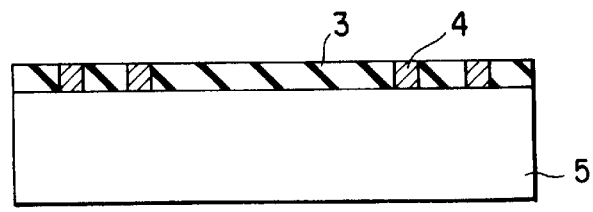

Then, as shown in FIG. 2A, a wafer 1 is diced to provide semiconductor chips 5 as shown in FIG. 2B.

By these steps, a semiconductor chip 5 according to the present invention is completed.

Mounting the semiconductor chip 5 on the mounting substrate will be explained below. The mounting process is the same as that of, for example, a quad flat package (QFP) and small outline package (SOP).

Substrate electrodes 7 are provided on a mounting substrate 6. First, the brazing or soldering material 8 is coated on the substrate electrodes 7 by a proper method such as a printing method. Thereafter, as shown in FIG. 3A, the semiconductor chip 5 with connection electrodes 4 provided thereon is mounted on the mounting substrate 6 with the connection electrode mounting surface facing the mounting substrate 6. At the time of mounting, the connection electrode 4 is located on the soldering or brazing material 8 on the substrate electrode 7.

Thereafter, the semiconductor chip mounting substrate 7 is introduced into a high temperature furnace where the soldering or brazing material 8 is reflowed. As a result, the substrate electrode 7 is connected to the connection electrode 4 of the semiconductor chip 5 as shown in FIG. 3B.

At the time of reflowing, the thermoplastic resin 3 coated on the surface of the semiconductor chip 5 is molten, so that the semiconductor chip 5 is bonded by the resin 3 to the mounting substrate 6.

In this way, a package structure is formed where the semiconductor chip 5 is mounted on the mounting substrate 6.

Although, in the above-mentioned embodiment, the bump electrodes 2 and resin film 3 have been explained as being formed on the semiconductor device areas of the wafer 1, it may also be possible to dice the wafer into semiconductor chips 5 and form the bump electrodes 2 and resin film 3 on the semiconductor chip 5.

According to the above-mentioned embodiment, the thermoplastic resin 3 is coated on the surface of the semiconductor chip 5 such that the top surface of the thermoplastic resin 3 is made parallel to the top surface of the connection electrode 4. If, therefore, the semiconductor chip is mounted on the mounting substrate and reflowing is effected, a bond is established between the connection electrode 4 and the substrate electrode 7. At the same time, the semiconductor chip 5 is bonded by the molten resin 3 to the mounting substrate 6 and the semiconductor chip 5 is encapsulated with the resin 3. This obviates the need to inject the resin into a clearance between the mounting substrate and the semiconductor chip, after the reflowing has been achieved, as in the case of the prior art. It is, therefore, possible to lower a cost involved.

In the present embodiment, the element areas of the semiconductor chip are protected by the resin and the resin by itself serves as a package. When, therefore, the semiconductor device is transported, it is possible to handle it in the same way as a normal package product.

According to the present invention, the semiconductor device has substantially the same size as that of the semiconductor chip and it is possible to achieve a compact package.

For the present embodiment, the wafer as it is coated with the resin, before it is diced into the semiconductor chips, so that the assembling cost can be lowered.

FIG. 4 shows a second embodiment of the present invention.

The second embodiment is the same as the first embodiment except that the surface of the wafer 1 is coated with two kinds of resin to provide a double resin layer structure.

As set out above, bump electrodes 2 are formed on the wafer 1 and the bump electrode-mounted surface of the wafer 1 is coated with a thermosetting resin 10, that is, a resin not molten upon being heated. The surface of the thermosetting resin 10 lies in a position lower than the top surface of the bump electrode 2.

A thermoplastic resin 9 is coated on the thermosetting resin 10 and the surface of the thermoplastic resin 9 lies in a position higher than the top of the bump electrode 2. The glass transition temperature of the thermoplastic resin is equal to, or less than, the melting point of the soldering or brazing material.

As in the first embodiment, until the bump electrode 2 is exposed and its exposed area becomes enough great to be bonded, the resin 9 and bump 2 are polished parallel to the wafer. The subsequent steps are the same as in the first embodiment.

In the present embodiment, an adhesive sheet and bonding agent can be used in place of the thermoplastic resin 9.

According to the second embodiment, unlike the first embodiment, the resin 9 is molten at an area to be bonded to the mounting substrate 6 at a time of reflowing. For this reason, the height, diameter, etc., of the connection electrode 4 suffer less damage due to the flow of the resin, thus preventing an electrode-to-electrode short-circuiting. As in the first embodiment, it is possible to simultaneously achieve connection between the connection electrode 4 of the semiconductor chip 5 and the substrate electrode 7 as well as an insulation with the resin.

FIG. 5 shows a third embodiment of the present invention.

First, as in the first and second embodiments, the third embodiment is of such a type that bump electrodes 2 are formed on the surface of a wafer 1 and that the surface of the wafer 1 is coated with resin as one layer or a multi-layered structure.

Then, resin 11 is coated on the rear surface of the wafer 1 and it may be thermoplastic or thermosetting resin.

As in the case of the first and second embodiments, the resin and bump electrodes on the surface of the wafer 1 are polished until the bump electrode 2 is exposed and its exposed area is enough great to be bonded.

Thereafter, the wafer 1 is diced into semiconductor chips 5. FIG. 5 shows the cross-section of the semiconductor device thus formed.

In the embodiment shown in FIGS. 1 to 4, the resin is coated only at the surface of the wafer where the bump electrodes 2 are mounted and the other surface of the wafer is not coated with the resin. Therefore, there is a possibility that the wafer will sometimes warp. In the third embodiment, it is possible to obtain the same advantage as in the first and second embodiments and also to prevent a warp in the wafer because the resin 11 is coated also to the rear surface of the wafer 1.

Figure 6A:
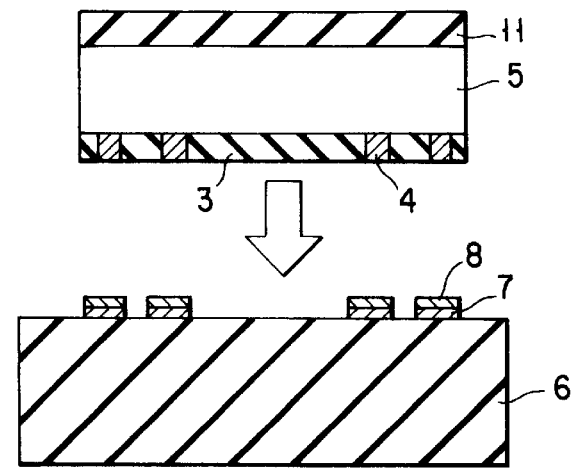
FIGS. 6A and 6B are cross-sectional views showing the third embodiment of the present invention.
Figure 6B:
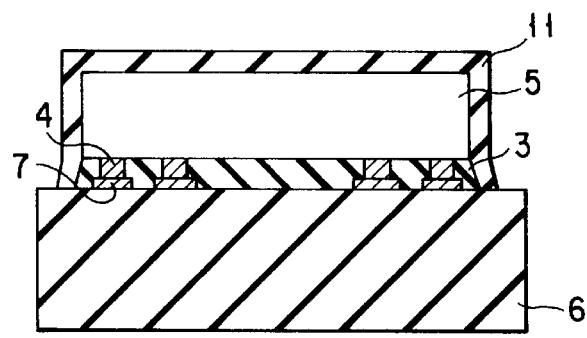

Further, in the case where the thermoplastic resin is used as the resin 11, as shown in FIGS. 6A and 6B, the semiconductor chip 5 is mounted on the mounting surface 6 and, at a time of reflowing, the resin 11 is molten and flowed, so that the four side surfaces of the semiconductor chip 5 is covered with the resin 11. In this case, the resultant semiconductor chip 5 ensures high reliability as well as high resistance to moisture.

Figure 7:
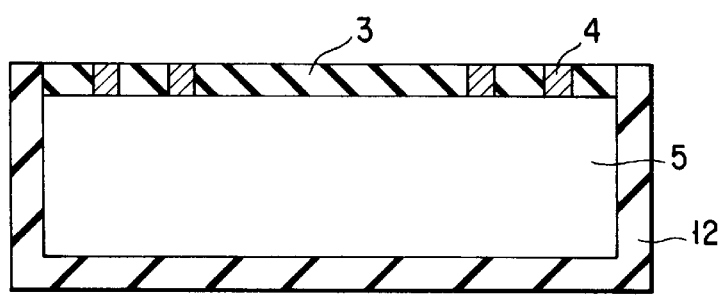
FIG. 7 is a cross-sectional view showing a fourth embodiment of the present invention.

FIG. 7 shows a fourth embodiment of the present invention.

First, as in the first and second embodiments, the bump electrodes 2 are provided on the wafer 1 and the resin is coated on the surface of the wafer where bump electrodes are provided. And the resin and bump electrodes are polished to provide a connection electrode 4. Then the wafer is diced into semiconductor chips 5.

Then the rear surface and four side surfaces of the semiconductor chip 5, that is, these surfaces not coated with resin, are coated with resin by a proper method such as dipping. The subsequent steps are the same as in the first and second embodiments.

In the fourth embodiment, it is possible to obtain the same advantage as in the first and second embodiments and also to provide enhanced moisture resistance to the semiconductor chip 5.

Figure 8:
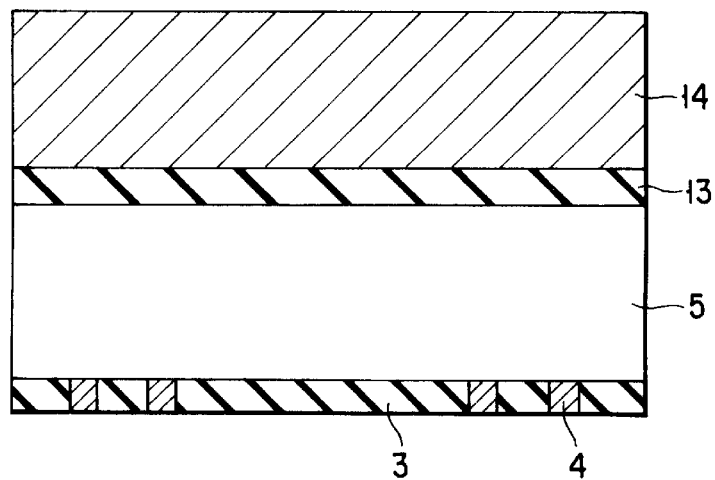
FIG. 8 is a cross-sectional view showing a fifth embodiment of the present invention.
Figure 9:
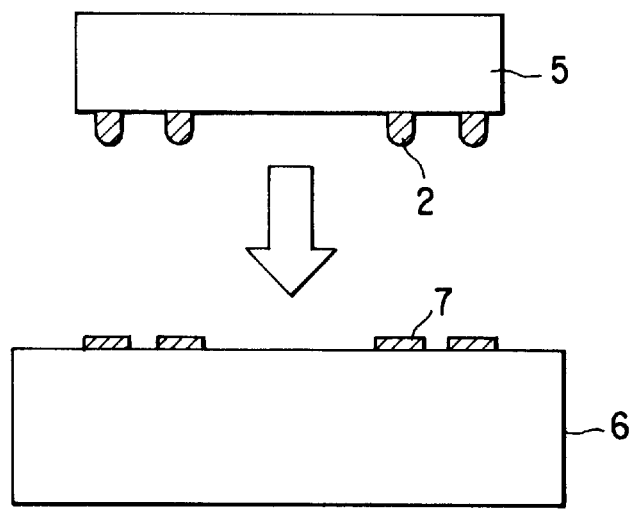
FIG. 9 shows a conventional method for mounting a semiconductor chip using a flip-chip connection.
Figure 10:
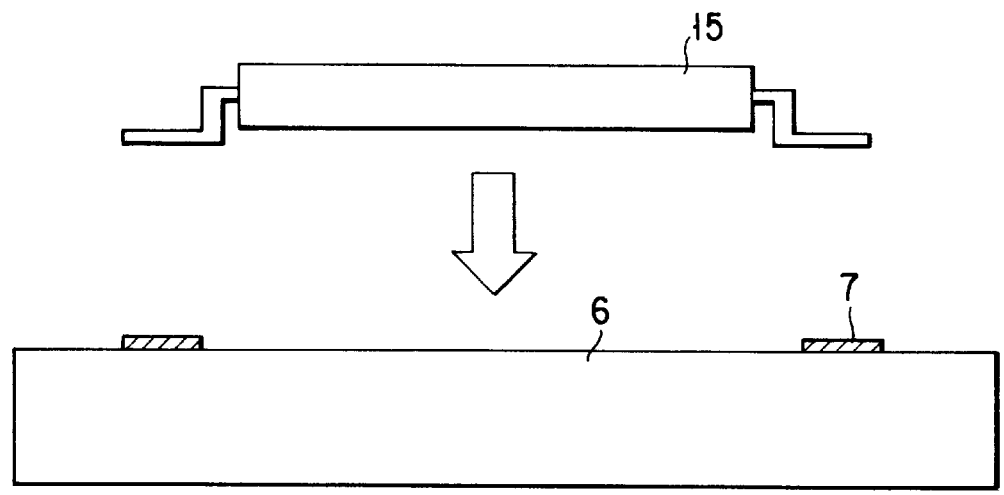
FIG. 10 is a view showing a conventional method for mounting a semiconductor package on a mounting substrate.

FIG. 8 shows a fifth embodiment of the present invention.

First, bump electrodes 2 are mounted on the wafer 1 and resin is coated on the surface of the wafer where the bump electrodes are provided. And the resin and bump electrode are polished to provide a connection electrode 4.

To the rear surface of the wafer 1, that is, the surface not coated with resin, a metal plate 14 is bonded with the use of an adhesive resin or brazing (or soldering) material.

Then, the wafer 1 is diced into semiconductor chip 5 as shown in FIG. 8. Subsequent steps are the same as in the first and second embodiments.

In the fifth embodiment it is possible to obtain the same advantage as in the first and second embodiments. Since the metal plate 14 is bonded to the rear surface side of the semiconductor wafer, it is possible to prevent a warp in the wafer and in a package. It is easy to connect a cooling device or a heat sink to the semiconductor chip 5 via the metal plate 14.

Although, in the above-mentioned first and second embodiments, use is made, for the bump electrodes, of a metal material which is molten at a time of reflowing, the present invention is not restricted thereto. Even if, as the bump electrode, use is made of a metal material, such as gold or high-temperature solder, not molten at a time of reflowing, it is possible to achieve the object of the present invention with the same advantage.

Additional advantages and modifications will readily occur to those skilled in the art. Therefore, the invention in its broader aspects is not limited to the specific details, and representative embodiments shown and described herein. Accordingly, various modifications may be made without departing from the spirit or scope of the general inventive concept as defined by the appended claims and their equivalents.

I claim:

1. A semiconductor device comprising:
   a semiconductor chip; bump electrodes provided on the semiconductor chip; and a protection film coated on a surface of the semiconductor chip, allowing a top surface of the bump electrodes to be exposed, and adapted to, when the semiconductor chip is to be mounted, be molten and bond the semiconductor chip to a mounting substrate and encapsulate a resultant structure.

2. A semiconductor device according to claim 1, wherein the protection film is formed of thermoplastic resin.

3. A semiconductor device according to claim 1, wherein the protection film is formed of thermoplastic resin whose glass transition temperature is equal to, or less than, a melting point of a soldering or brazing material for connection to a terminal of a mounting substrate.

4. A semiconductor device according to claim 1, wherein the protection film is formed of a two-layered structure, one layer being formed of thermosetting resin provided on the semiconductor chip and the other layer being formed of thermoplastic resin provided on the thermosetting resin layer.

5. A semiconductor device according to claim 1, wherein the protection film is formed of a two-layered structure, one layer being formed of thermosetting resin provided on the semiconductor chip and the other layer being formed of thermoplastic resin formed on the thermosetting resin layer, and the thermoplastic resin having a glass transition temperature equal to, or less than, a melting point of a soldering or brazing material for connection to a terminal of a mounting substrate.

6. A semiconductor device according to claim 1, wherein a rear surface of the semiconductor chip is coated with resin.

7. A semiconductor device according to claim 1, wherein rear and side surfaces of the semiconductor chip are coated with resin.

8. A semiconductor device according to claim 1, wherein a rear surface of the semiconductor chip is bonded to a metal plate with either one of a resin layer and soldering or brazing layer in between.

9. A package structure comprising:

a mounting substrate;

connection terminals provided on a surface of the mounting substrate;

a soldering or brazing material provided on the connection terminals to allow terminal connection;

a semiconductor chip whose surface is so located as to face the surface of the mounting substrate;

bump electrodes provided on the surface of the semiconductor chip, the bump electrode being connected to the connection terminal by melting the soldering or brazing material for terminal connection; and a protection film covered on the facing surface of the semiconductor chip in a manner to expose top surfaces of the bump electrodes, the protection film being allowed to be molten, at a time of melting the soldering or brazing material, bond the semiconductor chip to the mounting substrate and encapsulate the chip.

* * * * *